United States Patent
Aikoh

(10) Patent No.: US 9,791,729 B2
(45) Date of Patent: Oct. 17, 2017

(54) LIQUID CRYSTAL DISPLAY UNIT AND PROJECTION DISPLAY APPARATUS

(71) Applicant: Sony Corporation, Tokyo (JP)

(72) Inventor: Yoshihisa Aikoh, Kanagawa (JP)

(73) Assignee: Sony Corporation, Tokyo (JP)

( * ) Notice: Subject to any disclaimer, the term of this patent is extended or adjusted under 35 U.S.C. 154(b) by 304 days.

(21) Appl. No.: 14/249,968

(22) Filed: Apr. 10, 2014

(65) Prior Publication Data

US 2014/0320753 A1    Oct. 30, 2014

(30) Foreign Application Priority Data

Apr. 26, 2013    (JP) .................................. 2013-093444

(51) Int. Cl.
| | |
|---|---|
| H01L 23/40 | (2006.01) |
| H04N 9/31 | (2006.01) |
| G02F 1/1362 | (2006.01) |
| G02F 1/1333 | (2006.01) |
| G03B 21/00 | (2006.01) |

(52) U.S. Cl.
CPC ..... *G02F 1/133308* (2013.01); *H04N 9/3105* (2013.01); *H04N 9/3141* (2013.01); *G02F 1/136277* (2013.01); *G02F 2001/133314* (2013.01); *G03B 21/006* (2013.01); *H01L 23/4006* (2013.01); *H04N 9/3144* (2013.01)

(58) Field of Classification Search
CPC .............. H04N 9/3144; H01L 23/4006; G02F 1/136277
See application file for complete search history.

(56) References Cited

U.S. PATENT DOCUMENTS

| | | |
|---|---|---|
| 2007/0008858 A1 | 1/2007 | Yukawa |
| 2008/0002555 A1 | 1/2008 | Hayasaka et al. |
| 2009/0067191 A1* | 3/2009 | Faber .................... F21V 29/004 362/580 |

(Continued)

FOREIGN PATENT DOCUMENTS

| | | |
|---|---|---|
| JP | 04-027929 A | 1/1992 |
| JP | 2001-154273 A | 6/2001 |

(Continued)

*Primary Examiner* — Nathanael R Briggs
*Assistant Examiner* — Alexander Gross
(74) *Attorney, Agent, or Firm* — Wolf, Greenfield & Sacks, P.C.

(57) ABSTRACT

A liquid crystal display unit includes a liquid crystal display element for modulating light; and a holder part which has a holding portion, at least one connecting portion, an attenuation portion, and a plurality of through-holes. The holding portion holds the liquid crystal display element. The connecting portion is formed integrally with the holding portion, and may be connected to a fixing member for fixing a position of the liquid crystal display element. The attenuation portion is formed in the area from the connecting portion to the holding portion, and attenuates a force transmitting from the connecting portion to the holding portion. The through-holes are formed in the at least one connecting portion. The through-holes include at least one cut-out-through-hole having its part opened. The through-holes allow insertion of connecting members for connection to the fixing member.

9 Claims, 15 Drawing Sheets

(56) References Cited

U.S. PATENT DOCUMENTS

| | | | |
|---|---|---|---|
| 2011/0194037 A1* | 8/2011 | Hirabayashi | G02F 1/133308 349/5 |
| 2011/0255250 A1* | 10/2011 | Dinh | G03B 15/03 361/749 |
| 2012/0293751 A1 | 11/2012 | Matsushima et al. | |
| 2013/0069216 A1* | 3/2013 | Miyake | H01L 23/02 257/687 |
| 2014/0307005 A1 | 10/2014 | Kita | |
| 2015/0373312 A1 | 12/2015 | Miura | |

FOREIGN PATENT DOCUMENTS

| | | |
|---|---|---|
| JP | 2002-116430 A | 4/2002 |
| JP | 2005-181719 A | 7/2005 |
| JP | 2006-343537 A | 12/2006 |
| JP | 2011-164248 A | 8/2011 |

* cited by examiner

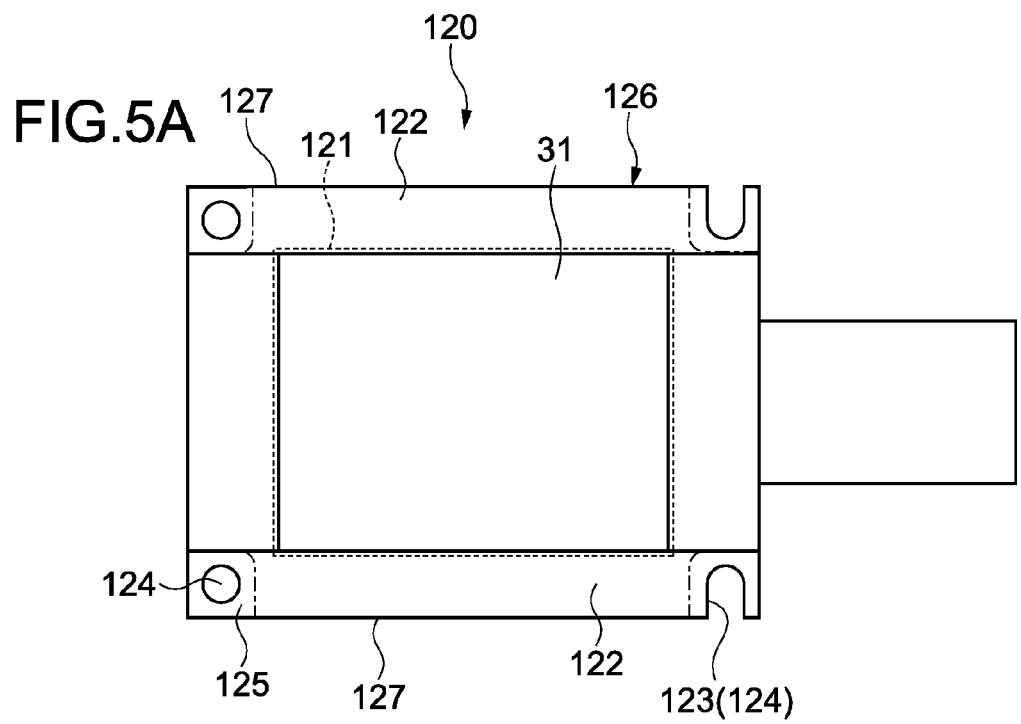

LIQUID CRYSTAL DISPLAY UNIT AND PROJECTION DISPLAY APPARATUS

CROSS REFERENCE TO RELATED APPLICATIONS

This application claims the benefit of Japanese Priority Patent Application JP 2013-093444 filed Apr. 26, 2013, the entire content of which is incorporated herein by reference.

BACKGROUND

The present disclosure relates to a liquid crystal display unit and a projection display apparatus which are capable of modulating light.

Projection display apparatuses such as projectors have been widely used from the past. An image can be displayed by, for example, the light from a light source being modulated by a light modulation element such as a liquid crystal element; the modulated light then being projected to a screen or the like. Examples of the light modulation elements to be used may include reflective liquid crystal display elements, transmissive liquid crystal display elements and the like.

A liquid crystal display unit including a liquid crystal display panel, a light-shielding plate, an optical compensation element and an optical compensation element holder has been disclosed in Japanese Patent Application Laid-Open No. 2013-54145 (hereinafter referred to as "Patent Document 1"). This liquid crystal display unit holds the optical compensation element so as not to contact other parts, and, as to be spaced from the light-shielding plate. This prevents external heat and forces from transmitting to the optical compensation element; thereby preventing an occurrence of unevenness in luminance in the projection screen.

A projection apparatus including a reflective panel unit having a reflection-type light modulation element; and a prism unit for combining and outputting light modulated by the light modulation element has been disclosed in Japanese Patent Application Laid-Open No. 2013-54143. In this projection apparatus, a fixing member is attached to both of the reflective panel and the prism unit. Accordingly, the reflective panel and the prism unit are bonded to each other via the fixing member attached to the both thereof. This has enabled adjustment of a registration of the projection apparatus with good precision.

SUMMARY

As in the above, there has been a demand for a projection display apparatus which is capable of preventing deterioration in image quality and deviation in registration from being caused by external force and heat.

In view of the above-mentioned circumstances, it is desirable to provide a liquid crystal display unit and a projection display apparatus which are capable of preventing influence of external force and heat.

According to an embodiment of the present disclosure, there is provided a liquid crystal display unit including a liquid crystal display element and a holder part.

The liquid crystal display element is configured to modulate light.

The holder part has a holding portion, at least one connecting portion, an attenuation portion, and a plurality of through-holes.

The holding portion is configured to hold the liquid crystal display element.

The connecting portion is formed integrally with the holding portion, and is configured to be connected to a fixing member for fixing a position of the liquid crystal display element.

The attenuation portion is formed in the area from the connecting portion to the holding portion, and is configured to attenuate a force transmitting from the connecting portion to the holding portion.

The through-holes are formed in the at least one connecting portion. The through-holes include at least one cut-out-through-hole having its part opened. The through-holes are configured to allow insertion of connecting members for connection to the fixing member.

In this liquid crystal display unit, the liquid crystal display element would be held by the holding portion of the holder part. The holder part is connected to the fixing member by the connecting portion. Since the attenuation portion is formed in the area from the connecting portion to the holding portion, it can prevent transmission of stress to the holding portion which stress is generated in the connecting portion by external force or the like. In addition, since the cut-out-through-hole having its part opened is formed as the through-holes which allow insertion of the connecting members, it can prevent influence of effects such as expansion of the holder part due to heat. It thus makes it possible to prevent influence of external force or heat.

The holding portion may have a first thickness. In this case, the attenuation portion may be formed in a second thickness smaller than the first thickness.

In this liquid crystal display unit, the attenuation portion is formed in the second thickness which is smaller than the first thickness of the holding portion. By the portion having relatively small thickness formed as the attenuation portion, the force toward the holding portion can be attenuated.

The connecting portion may be formed in the second thickness to serve as the attenuation portion.

In such a manner, the connecting portion to be connected to the holding portion may be formed as the attenuation portion. This may allow sufficient attenuation of the forces transmitting to the holding portion.

The second thickness may be one-half of the first thickness or smaller.

In such a manner, by setting the second thickness to one-half of the first thickness or smaller, it may allow sufficient attenuation of the forces transmitting to the holding portion.

The holder part may have a substantially rectangular shape and have a pair of long sides opposite to each other. In this case, the holding portion may be formed in a center of each of the long sides. The at least one connecting portion may include four connecting portions formed in both ends of the long sides. Further, the attenuation portion may be formed in the second thickness, in areas from the respective connecting portions to the holding portion of the long sides.

In such a manner, the liquid crystal display element may be held by the pair of long sides each forming the attenuation portion. The attenuation portion enables to prevent deformation of the holding portion due to external force, and prevent positional shifts due to thermal expansion or the like. As a result, it makes it possible to prevent deterioration in image quality in a projected image, and prevent deviation in registration.

Each cut-out-through-hole may have its part opened toward an outer edge of the long sides.

This makes it possible to sufficiently absorb expansion, and the like, in the extending direction of the long sides.

Each cut-out-through-hole may be formed in each of two connecting portions among the four connecting portions, the two connecting portions being formed at a same end of the respective long sides.

In such a manner, the cut-out-through-holes may be formed at the same end of the pair of long sides.

Each cut-out-through-hole may be formed in each of two connecting portions among the four connecting portions, the two connecting portions being formed at the both ends of one long side of the long sides.

In such a manner, the cut-out-through-holes may be formed at the both ends of one long side. This makes it possible to sufficiently absorb thermal expansion and the like.

The long sides may extend in a same direction as a connecting direction for connecting a flexible circuit board to the liquid crystal display element.

In such a manner, the long sides for holding the liquid crystal display element may be formed extending in the connecting direction of the flexible circuit board.

The holder part may have a substantially rectangular shape. In this case, the holding portion may be formed in a center of the holder part. Further, the at least one connecting portion may include four connecting portions formed in four corners of the holder part.

In such a manner, the holding portion may be formed in the center of the holder part, and the holder part may be connected to the fixing member by the four connecting portions formed in the four corners of the holder part. In this case as well, by the attenuation portion being formed in the areas from the connecting portions to the holding portion; or by the connecting portions being formed as the attenuation portion, it makes it possible to prevent influence of external force or heat.

The liquid crystal display element may be a reflective liquid crystal display element.

A projection display apparatus according to an embodiment of the present disclosure includes a light source configured to emit light; and the liquid crystal display unit of the above. The light from the light source is to be modulated by the liquid crystal display unit.

As described above, the embodiments of the present disclosure may make it possible to prevent influence of external force or heat.

These and other objects, features and advantages of the present disclosure will become more apparent in light of the following detailed description of best mode embodiments thereof, as illustrated in the accompanying drawings.

BRIEF DESCRIPTION OF DRAWINGS

FIGS. 5A and 5B are figures showing a variation example of the liquid crystal display unit according to the first embodiment;

DETAILED DESCRIPTION OF EMBODIMENTS

Hereinafter, embodiments of the present disclosure will be described with reference to the drawings.

First Embodiment

Projection Display Apparatus

Figure 1:
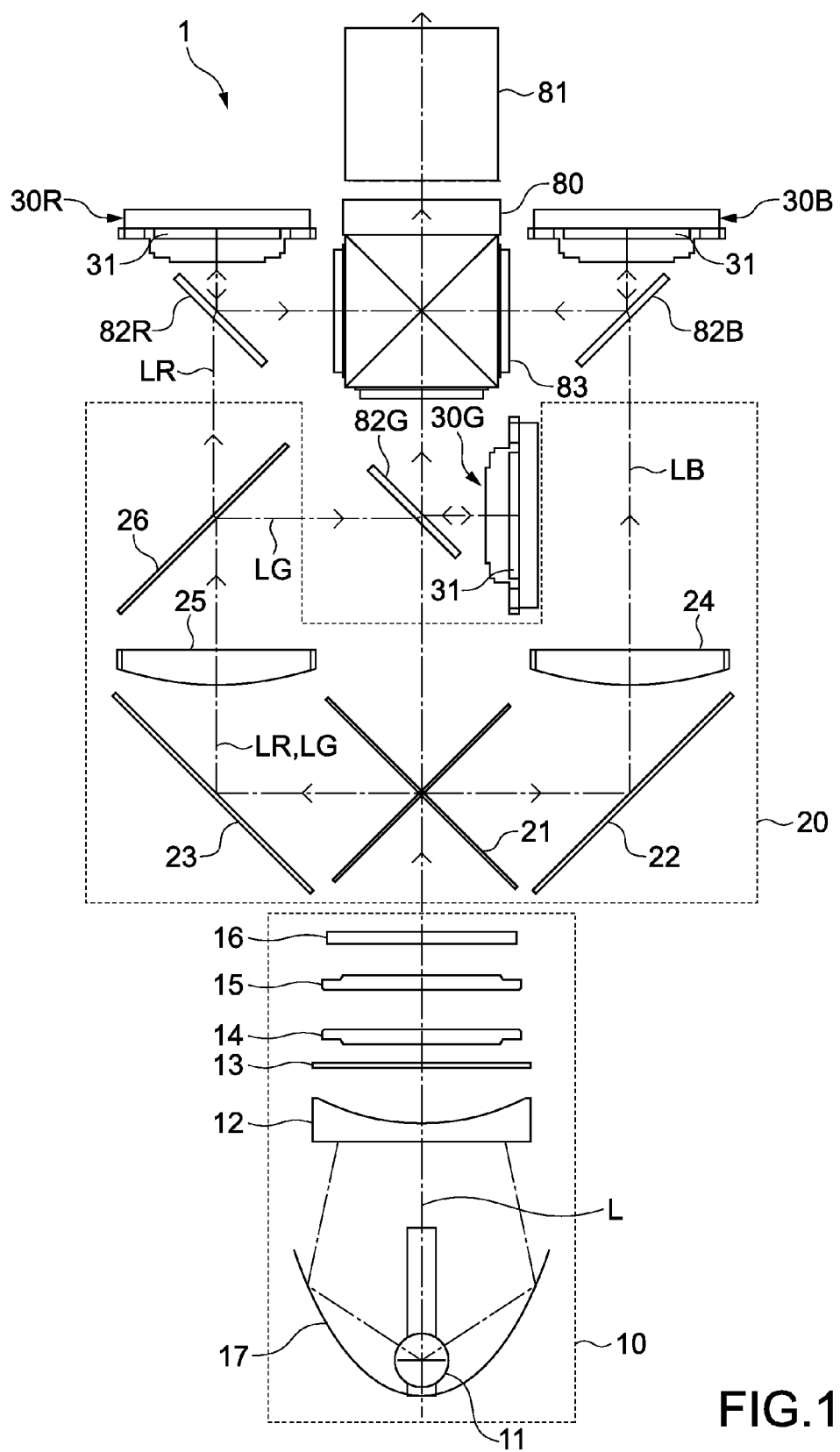
FIG. 1 is a figure showing a schematic configuration of a projection display apparatus according to a first embodiment of the present disclosure.

FIG. 1 is a figure showing a schematic configuration of a projection display apparatus according to a first embodiment of the present disclosure. A projection display apparatus 1 is configured to modulate light for every colored light of red, green and blue (colored lights of RGB), and combine the modulated light of these colors (images), so as to project and display a color image. The projection display apparatus 1 may be used as, for example, a projector for digital cinemas. The present disclosure is also applicable to a display apparatus for other uses.

As shown in FIG. 1, the projection display apparatus 1 includes illumination optics 10 configured to emit light L; spectroscopic optics 20 configured to split the light L output from the illumination optics 10; and three liquid crystal display units 30 (30R, 30G and 30B) configured to modulate the light L. Further, the projection display apparatus 1 includes a light-combining unit 80 configured to combine the light L modulated by the three liquid crystal display units 30R, 30G and 30B; and a projection lens system 81 configured to project the light L combined by the light-combining unit 80. Furthermore, between the spectroscopic optics 20 and the three liquid crystal display units 30R, 30G and 30B, respectively, reflective polarizing elements 82R, 82G and 82B are provided.

The illumination optics 10 includes a light source 11; a concave lens 12 for adjusting the light L output from the light source 11 into substantially parallel light; a UV cut filter 13; a first fly-eye lens array 14; a second fly-eye lens array 15; and a condenser lens 16.

Examples of light sources that may be used as the light source 11 include a xenon lamp, a halogen lamp, an ultra-high pressure mercury lamp and the like. A reflector 17 for reflecting the light L output from the light source 11 is provided around the light source 11. The light L reflected by the reflector 17 is output to the concave lens 12. The light transmitted through the concave lens 12 is output to the UV cut filter 13; and the UV cut filter 13 removes ultraviolet light from the output light. Incidentally, also a laser light source capable of emitting laser light may be used as the light source.

The light L transmitted through the UV cut filter 13 enters the first and second fly-eye lens arrays 14 and 15. As the light L is transmitted through the first and second fly-eye lens arrays 14 and 15, unevenness in luminance of the light L is reduced. The light L transmitted through the first and second fly-eye lens arrays 14 and 15 enters the condenser lens 16. The light L incident on the condenser lens 16 is condensed and output to the spectroscopic optics 20.

The spectroscopic optics 20 includes a first dichroic mirror 21; two reflection mirrors 22 and 23; two condenser lenses 24 and 25; and a second dichroic mirror 26. The first dichroic mirror 21 is configured to split the light L output from the illumination optics 10 into blue light LB having a relatively short wavelength; and red light LR and green light LG having longer wavelengths. The blue light LB output from the first dichroic mirror 21 is reflected by the first reflection mirror 22 and incident on the first condenser lens 24. Subsequently, the blue light LB is condensed by the first condenser lens 24, to enter the liquid crystal display unit 30B through the reflective polarizing element 82B. A prism-type beam splitter, a wire-grid polarizer, or the like, may be used as the reflective polarizing element 82B.

The red light LR and the green light LG output from the first dichroic mirror 21 are reflected by the second reflection mirror 23 and incident on the second condenser lens 25. Subsequently, the red light LR and the green light LG are condensed by the second condenser lens 25 and output to the second dichroic mirror 26. The second dichroic mirror 26 is configured to split the red light LR and the green light LG, into the green light LG having a relatively short wavelength; and the red light LR having a longer wavelength. The resulting red light LR enters the liquid crystal display unit 30R through the reflective polarizing element 82R. The green light LG enters the liquid crystal display unit 30G through the reflective polarizing element 82G.

Each of the colored light LR, LG and LB incident on the liquid crystal display units 30R, 30G and 30B is modulated into an image light having an intensity distribution according to its corresponding image information, and then is reflected, by a corresponding reflective liquid crystal panel 31 provided in the liquid crystal display units 30R, 30G and 30B. Subsequently, the three modulated image lights, respectively, are reflected by the reflective polarizing elements 82R, 82G and 82B, to enter the light-combining unit 80. At this time, polarization directions of the modulated light of each color may be arranged in a same direction, by a corresponding polarizing plate 83 provided on the light-combining unit 80. This allows the contrast to be improved.

Each of the liquid crystal panels 31 in this embodiment corresponds to the "liquid crystal display element", which is configured to modulate the light from the light source. Detailed configurations of the liquid crystal display units 30R, 30G and 30B will be described later.

The light-combining unit 80 may include, for example, a dichroic prism and others. The light-combining unit 80 is configured to combine the three lights modulated by the liquid crystal display units 30R, 30G and 30B, onto the same light path, and output the combined light to the projection lens system 81. The combined light may be expanded by a predetermined magnification and projected by the projection lens system 81 on a screen that is not shown in the figure. This allows a color image to be displayed.

The above-mentioned reflective polarizing elements 82R, 82G and 82B, polarizing plates 83 and the light-combining unit 80 may be held by a holding member that is not shown in the figure. The liquid crystal display units 30R, 30G and 30B may be fixed to their respective predetermined positions of this holding member.

[Liquid Crystal Display Unit]

Figure 2:
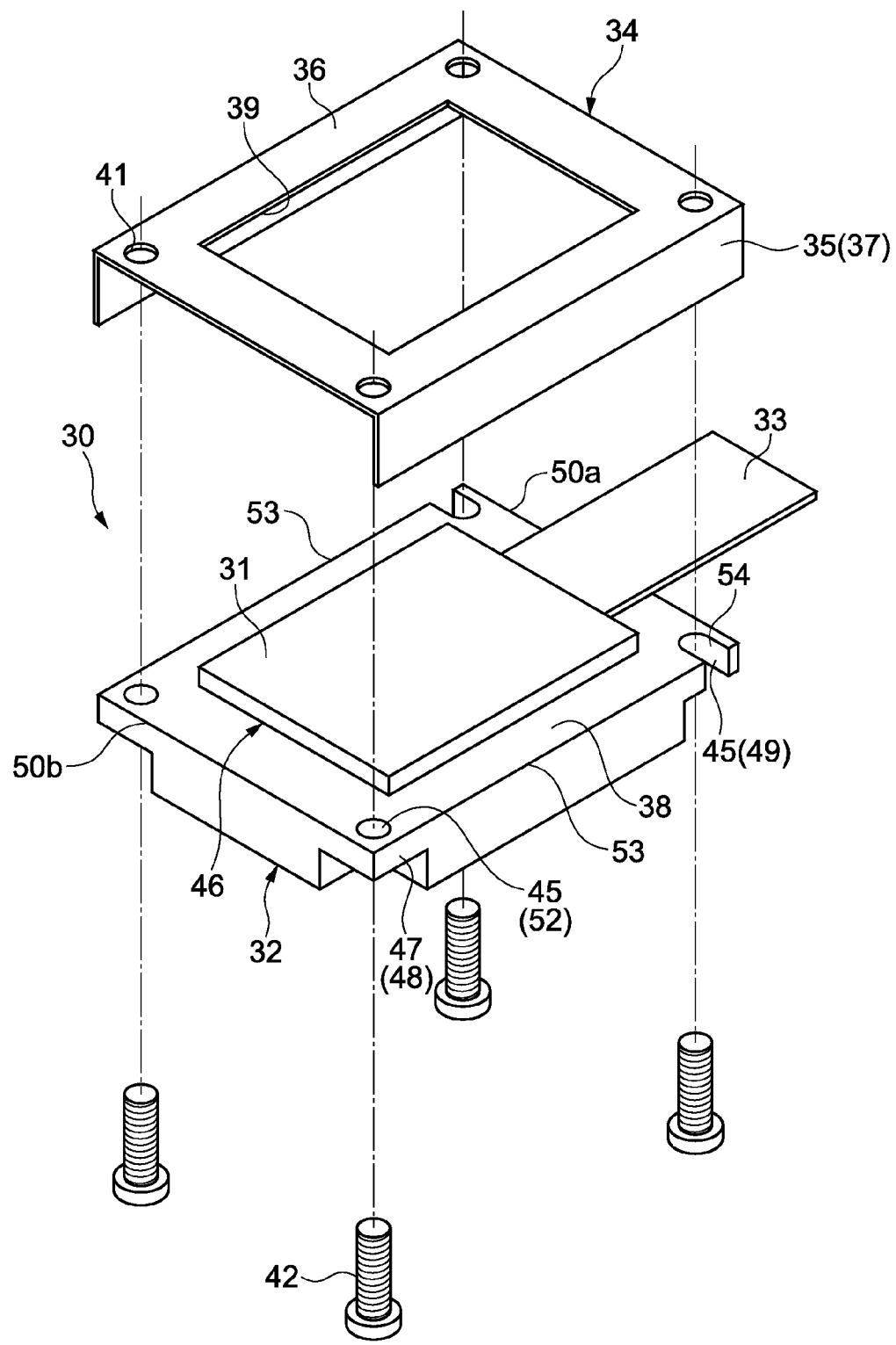
FIG. 2 is a perspective view showing a schematic configuration of a liquid crystal display unit according to the first embodiment.
Figure 3A:
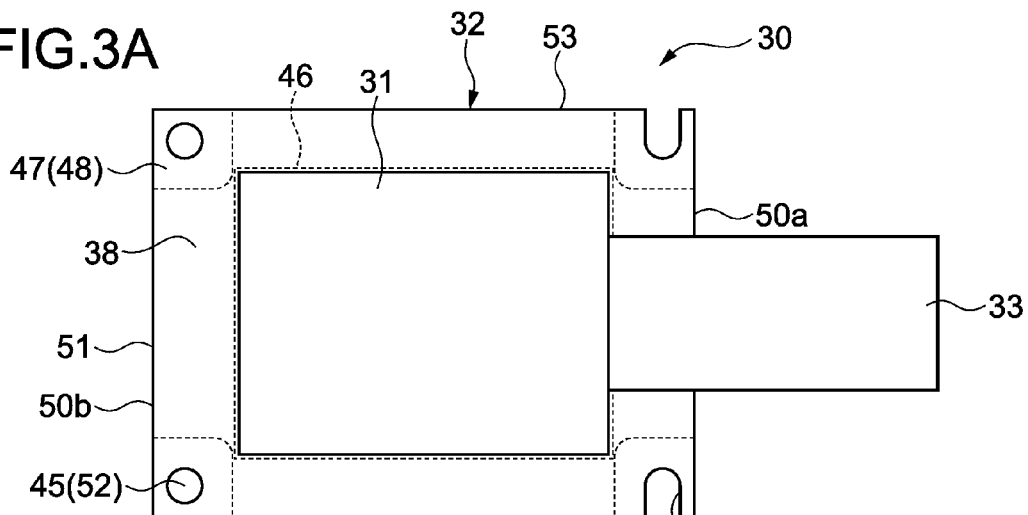
FIGS. 3A to 3C, respectively, are a top view, side view and a bottom view showing a schematic configuration of the liquid crystal display unit.
Figure 3B:
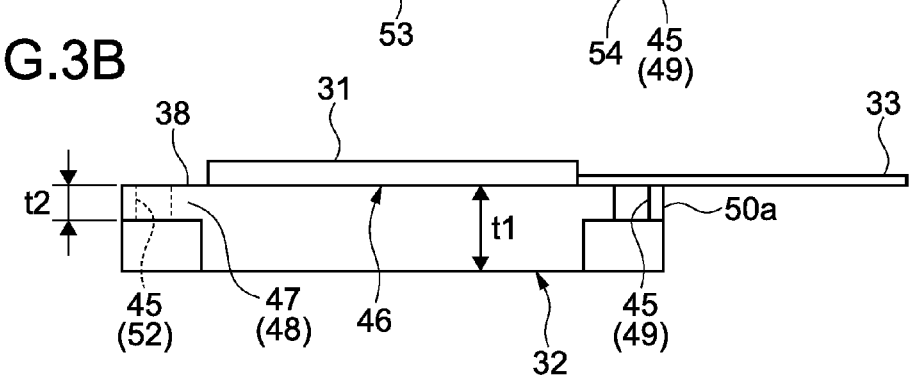
Figure 3C:
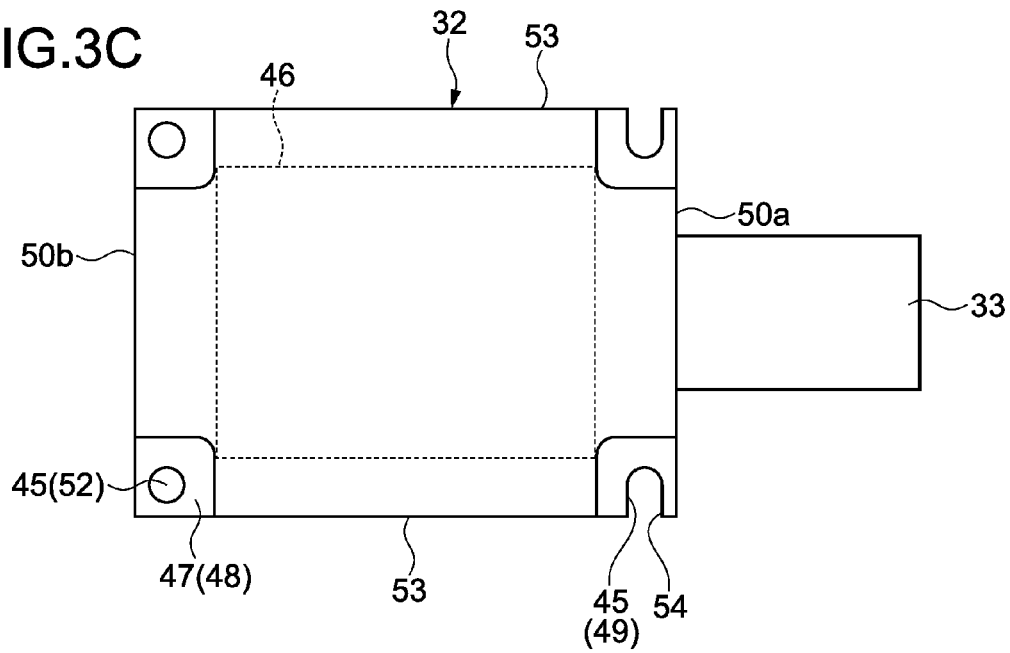
Figure 4A:
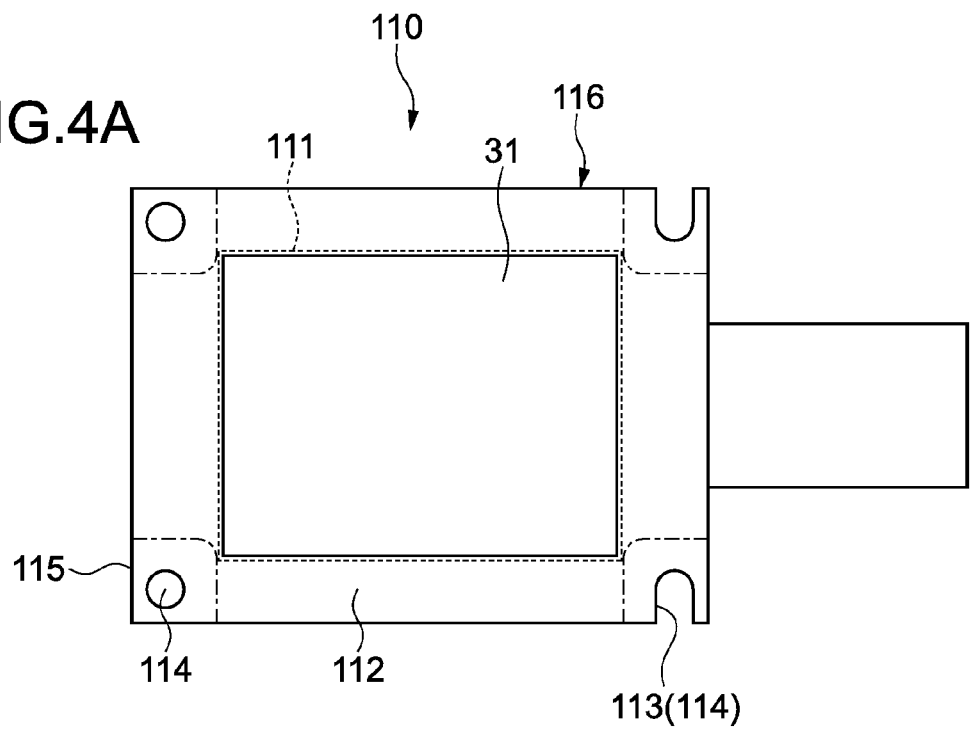
FIGS. 4A and 4B are figures showing a variation example of the liquid crystal display unit according to the first embodiment.
Figure 4B:
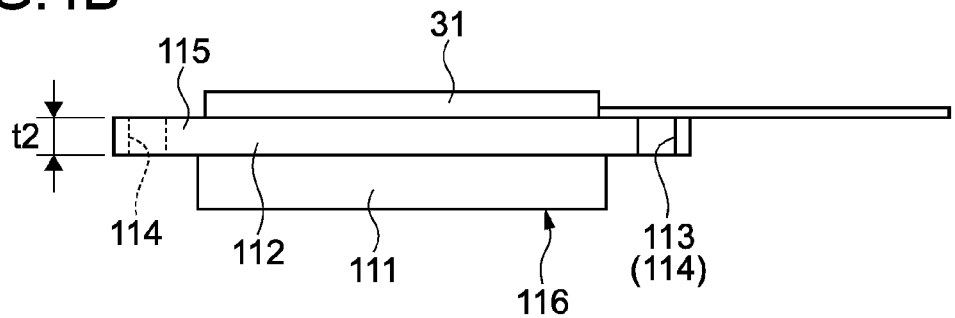

FIG. 2 is a perspective view showing a schematic configuration of the liquid crystal display unit 30 according to this embodiment. FIG. 3A is a top view of the liquid crystal display unit 30 as viewed from above. FIG. 3B is a side view of the liquid crystal display unit 30 as viewed from a side. FIG. 3C is a bottom view of the liquid crystal display unit 30 as viewed from below.

The liquid crystal display unit 30 includes the liquid crystal panel 31; and a holder part 32 for holding the liquid crystal panel 31. The liquid crystal panel 31 is configured so that a flexible circuit board 33 may be connected thereto; and image signals may be output to the liquid crystal panel 31 via this flexible circuit board 33. In addition, the liquid crystal display unit 30 may have a cooling structural member such as a heat sink, which is not shown in the figure, on a rear surface side of the holder part 32.

The holder part 32 is configured to be connected to a fixing member 34 for fixing a position of the liquid crystal panel 31 within the projection display apparatus 1. The fixing member 34 may be fixed via an adhesive material, or the like, to the above-mentioned holding member for holding the reflective polarizing elements 82R, 82G and 82B, and the like. By connecting the holder part 32 to such a fixing member 34, it allows the three liquid crystal panels 31 for modulating the colored lights to be fixed in their appropriate position; thereby realizing adjustment of registration (superposition of colored images of RGB).

The fixing member 34 may be made of a metal plate having a substantially rectangular shape, and formed by folding of a pair of edge portions 35 thereof opposite to each other. An area in the center of the fixing member 34 between the pair of edge portions 35 is a principal surface portion 36, and the folded parts of the edge portions 35 are side surface portions 37. The principal surface portion 36 may be formed in substantially the same size as a principal surface portion 38 of the holder part 32 on which the liquid crystal panel 31 would be placed. In a central area of the principal surface portion 36 of the fixing member 34, an opening 39 is formed in accordance with the size of the liquid crystal panel 31. The light L from the light source 11 would be incident on the liquid crystal panel 31 via this opening 39; and the light L modulated by the liquid crystal panel 31 would be output via the opening 39.

In the four corners of the principal surface portion 36 of the fixing member 34, screw-holes 41 which penetrate through the principal surface portion 36 may be formed. The screw-holes 41 are located around the opening 39, respectively, at the four corners of the opening 39. As shown in FIG. 2, from a rear side of the holder part 32, through a plurality of through-holes 45 of the holder part 32, screws 42 may be inserted into the screw-holes 41. The holder part 32 is thus connected to the fixing member 34. A configuration of the fixing member 34 is not limited to one shown in FIG.

2, but may be designed as appropriate. It should be noted that the four screws 42 in this embodiment correspond to the "connecting members".

As shown in FIG. 2 and FIGS. 3A to 3C, the holder part 32 includes a holding portion 46 configured to hold the liquid crystal panel 31; connecting portions 47 configured to be connected to the fixing member; and a plurality of through-holes 45 formed in the connecting portions 47. The holder part 32 further includes an attenuation portion 48 configured to attenuate a force transmitting from the connecting portions 47 to the holding portion 46. As described below, the connecting portions 47 in this embodiment are formed to serve as the attenuation portion 48.

The holder part 32 has a substantially rectangular shape as viewed from above, having a long-side direction along a same direction as a connecting direction for connecting the flexible circuit board 33; and a short-side direction perpendicular to the long-side direction. The liquid crystal panel 31 is held by a central area of the principal surface portion 38 of the holder part 32. That is, the holding portion 46 is formed in the center of the holder part 32.

The connecting portions 47 are formed integrally with the holding portion 46. In this embodiment, four connecting portions 47 are formed in four corners of the holder part 32. As shown in FIG. 3B, the thickness of the connecting portions 47 is smaller than that of the holding portion 46. That is, if the holding portion 46 had a first thickness t1, the connecting portions 47 would be formed in a second thickness t2 that is smaller than the first thickness t1. As a result, the connecting portions 47 would also function as the attenuation portion 48. For example, in cases where external force or the like is applied to the connecting portion 47 to generate stress therein, it makes it possible to allow deformation of the relatively thin connecting portion 47, and absorption of the forces. It thus allows attenuation of the forces transmitting to the holding portion 46.

Furthermore, in cases where a thermal expansion takes place in the holder part 32, it makes it possible to allow the relatively thin connecting portion 47 (the attenuation portion 48) to absorb the stress due to the expansion and release the overall stress in the holder part 32. This enables to prevent an occurrence of distortion of the liquid crystal panel 31; thereby preventing deterioration in image quality in a projected image, deviation in registration, and the like.

In this embodiment, as described above, a portion having smaller thickness than the holding portion 46 is formed as the attenuation portion 48. By allowing the attenuation portion 48 to absorb the forces, it allows attenuation of the forces transmitting to the holding portion 46. In this embodiment, the connecting portion 47 to be connected to the fixing member 34 is formed in the second thickness t2, to serve as the attenuation portion 48. This allows the forces to be absorbed in the connecting portion 47; thereby reducing the force itself, which is generated by the connecting portion 47. It thus makes it possible to allow sufficient attenuation of the forces transmitting to the holding portion 46.

It does not limit how small the second thickness t2 can be in comparison to the first thickness t1; but it was likely that the occurrence of problems such as distortion of the holding portion 46 could be fully prevented by setting the second thickness t2 to one-half of the first thickness t1 or smaller. In addition, sufficient effect was obtained also when the second thickness t2 was one-third of the first thickness t1 or smaller; and when it was one-quarter or smaller. The second thickness t2 may be set as appropriate based on the size, material, and the like, of the holder part 32. Furthermore, in cases where a plurality of attenuation portions 48 is to be formed, the thicknesses of the respective attenuation portions 48 may be the same or different to each other. Each of the attenuation portions 48 may have the appropriate thickness set within the range, smaller than the first thickness t1.

Further, as shown in FIGS. 3A and 3C, among the through-holes 45 being configured to allow insertion of the screws 42 for connection to the fixing member 34, at least one through-hole is formed as a cut-out-through-hole 49 having its part opened. In this embodiment, two connection portions 47 in the both ends of one short side 50a where the flexible circuit board 33 would be connected have the cut-out-through-holes 49 respectively formed thereto. The other two connection portions 47 in the both ends of the other short side 50b have two through-holes 52 respectively formed thereto, each having their circumference closed. Each of the two cut-out-through-holes 49 has its part opened toward an outer edge of a pair of long sides 53. That is, a part of the outer edge of the long side 53 forms an open end 54 of the cut-out-through-hole 49 to form a discontinuous part.

Thus, in this embodiment, some of the through-holes 45 being configured to allow insertion of the screws 42 are formed as the cut-out-through-holes 49. Accordingly, in cases where a thermal expansion takes place, the screw 42 can slide in a direction toward the open end 54 of the cut-out-through-hole 49. This may release the stress due to heat; and interrupt transmission of the stress to the liquid crystal panel 31. Further, it also makes it possible to absorb deformation of the holder part 32 by the discontinuous part being provided as the open end 54. Furthermore, since the through-hole 52 having its circumference closed is also formed as the through-hole 45, an overall displacement of the holder part 32 may be prevented with respect to the point of that through-hole 52. As a result, it makes it possible to prevent deviation in registration.

A method of forming the holder part 32 is not limited, and any method such as pressing and cutting may be employed.

Typical examples of materials of the fixing member 34 include a material having low linear expansion coefficient which is less affected by heat, so that it can sufficiently maintain the position of the liquid crystal panel 31. On the other hand, examples of materials of the holder part 32 include a material having high thermal conductivity such as aluminum and copper, so that it can be advantageous for transmitting heat to the above-mentioned cooling structural member. These materials may have relatively high linear expansion coefficient. The holding portion 46 may receive stress due to such a difference of the linear expansion coefficient between the fixing member 34 and the holder part 32, and a possible problem is that a distortion or displacement of the liquid crystal panel 31 might occur. However, in this embodiment, by providing the attenuation portion 48 and the cut-out-through-holes 49, it makes it possible to prevent influence of the stress due to the difference of the linear expansion coefficient between materials.

Incidentally, examples of the conditions that would lead to the stress due to heat may include both of the following: generation of heat during operation of the projection display apparatus 1; and changes in the environment in non-operation state (changes in temperature). Examples of the cases of generation of heat during operation include a case where heat is generated in the liquid crystal panel 31 upon receiving light and is transmitted the holder part 32; a case where the holder part 32 itself receives the light and generate heat, and the like. Examples of the changes in the environment in non-operation state may include changes in temperature from season to season, between daytime and nighttime in one day, a change in temperature when moved from the indoor to the outdoor, and the like. In any case, according to the present disclosure, it may enable to prevent deterioration in image quality due to irregularity of polarized light, or the like, which irregularity might have been caused by transmission of stress from the holder part 32 to an effective pixel part of the liquid crystal panel 31. In addition, it may enable to prevent an occurrence of deviation in registration which might have been caused by an occurrence of a small positional shift due to deformation by stress.

[Variation Examples of Liquid Crystal Display Unit]

FIGS. 4A and 4B to 7A and 7B are figures showing some variation examples of the liquid crystal display unit 30 according to the first embodiment. FIGS. 4A, 5A, 6A and 7A are top views and FIGS. 4B, 5B, 6B and 7B are side views. A liquid crystal display unit 110 shown in FIGS. 4A and 4B has an attenuation portion 112 in a whole circumference of a holding portion 111 which holds the liquid crystal panel 31. That is, a cutting process may have been applied to the whole circumference of the holding portion 111 to form the attenuation portion 112 having the second thickness t2 thereto. A plurality of through-holes 114 including at least one cut-out-through-hole 113 have been formed in four corners of the attenuation portion 112 being formed in the whole circumference of the holding portion 111. Accordingly, in this example, connecting portions 115 are formed as the attenuation portion 112. Further, the attenuation portion 112 is formed also in the areas from the connecting portions 115 to the holding portion 111, in the areas other than the connecting portions 115. Such a configuration may also make it possible to interrupt transmission of the stress to the liquid crystal panel 31 and prevent an overall displacement of the holder part 116.

The area from the connecting portion to the holding portion may also be the area being continuous to both of the connecting portion and the holding portion. Herein, the areas which are capable of absorbing the forces transmitting to the holding portion by allowing the deformation are generally referred to as the "area from the connecting portion to the holding portion". In addition, the area from the connecting portion to the holding portion is an area which also includes the area where the connecting portion has been formed. The attenuation portion may be formed in such an area.

A liquid crystal display unit 120 shown in FIGS. 5A and 5B has an attenuation portion 122 formed in the second thickness t2 in a part of a pair of long sides 127 of a holder part 126. A plurality of through-holes 124 including at least one cut-out-through-hole 123 have been formed in this attenuation portion 122. In this example as well, the attenuation portion 122 is formed in connecting portions 125; and also in the areas from the connecting portions 125 to the holding portion 121, in the areas other than the connecting portions 125. Such a configuration may also have an effect similar to the above.

Figure 6A:
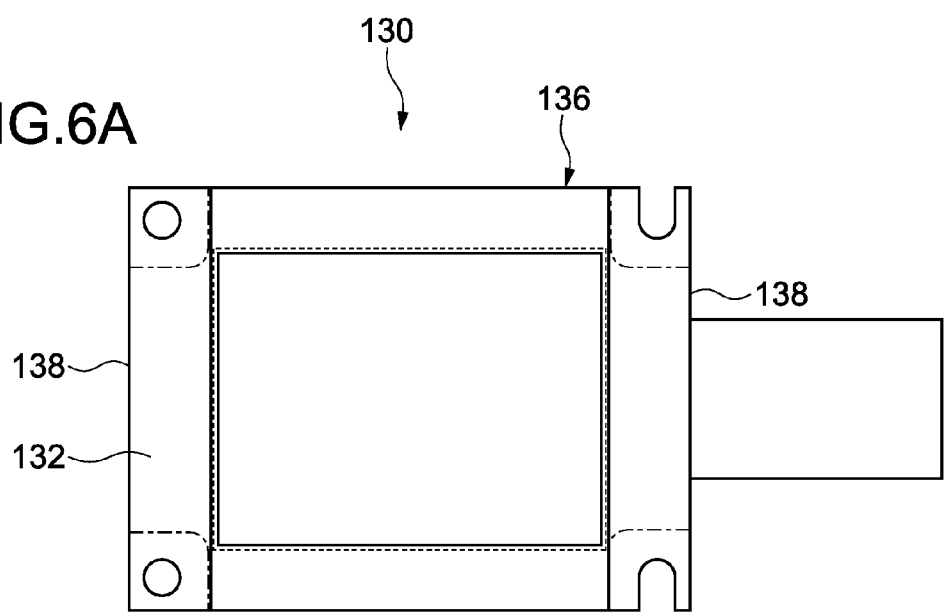
FIGS. 6A and 6B are figures showing a variation example of the liquid crystal display unit according to the first embodiment.
Figure 6B:
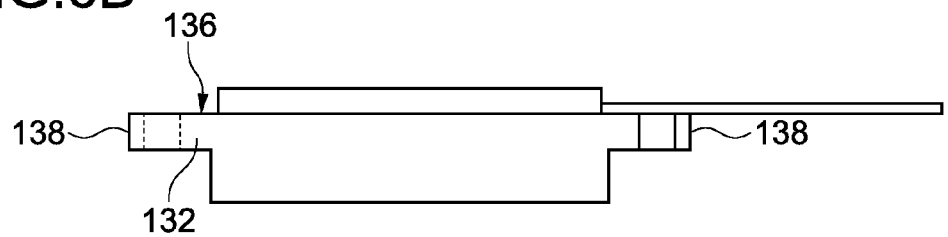

A liquid crystal display unit 130 shown in FIGS. 6A and 6B has an attenuation portion 132 formed in a part of two short sides 138 of a holder part 136. Such a configuration may also have an effect similar to the above.

Figure 7A:
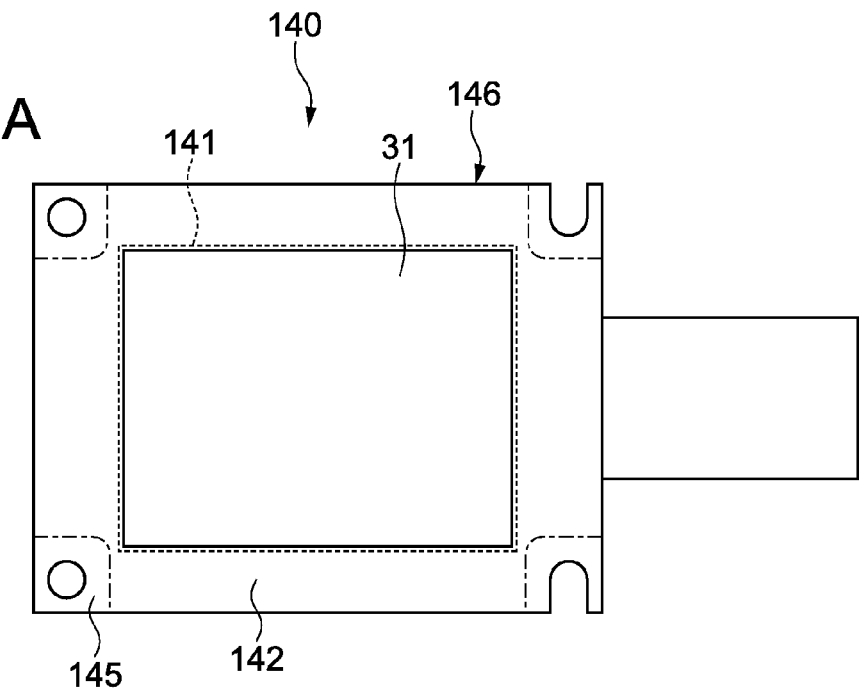
FIGS. 7A and 7B are figures showing a variation example of the liquid crystal display unit according to the first embodiment.
Figure 7B:
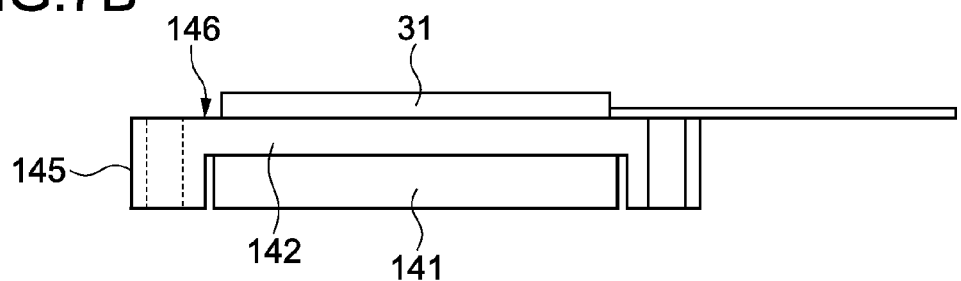

A liquid crystal display unit 140 shown in FIGS. 7A and 7B has an attenuation portion 142 formed in an area round the whole circumference of a holding portion 141 which holds the liquid crystal panel 31, except the areas where connecting portions 145 are formed. That is, in this example, the attenuation portion 142 is formed in the areas from the connecting portions 145 to the holding portion 141, in the areas other than the connecting portions 145. Such a configuration may also make it possible to interrupt transmission of the stress to the liquid crystal panel 31 and prevent an overall displacement of a holder part 146.

Figure 8:
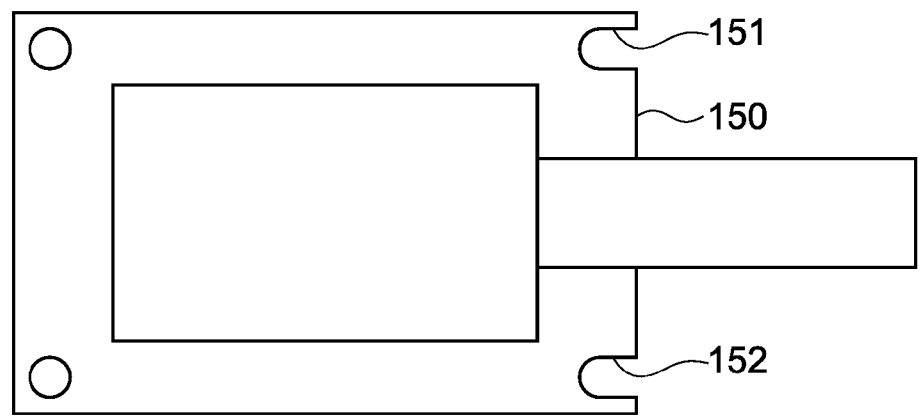
FIG. 8 is a figure showing a variation example of positions and shapes of cut-out-through-holes.

FIGS. 8 to 11 are figures showing some variation examples of positions and shapes of the cut-out-through-holes. For example, as shown in FIG. 8, in the both ends of a short side 150, cut-out-through-holes 151 may be formed, and each of the cut-out-through-holes 151 may have its part opened toward an outer edge of the short side 150. In this case, a part of the outer edge of the short side 150 forms an open end 152 of the cut-out-through-hole 151 to form a discontinuous part.

Figure 9:
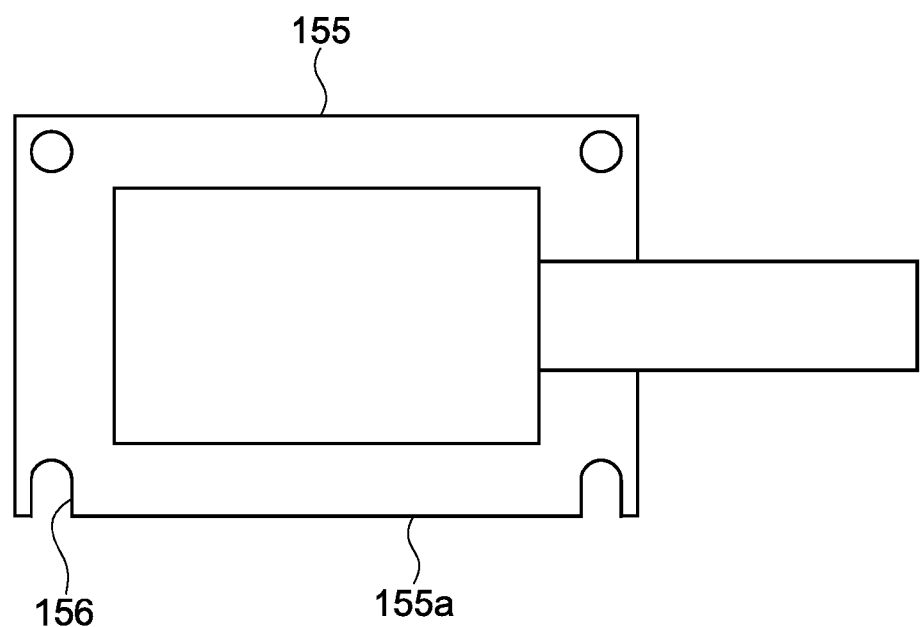
FIG. 9 is a figure showing a variation example of positions and shapes of cut-out-through-holes.
Figure 10:
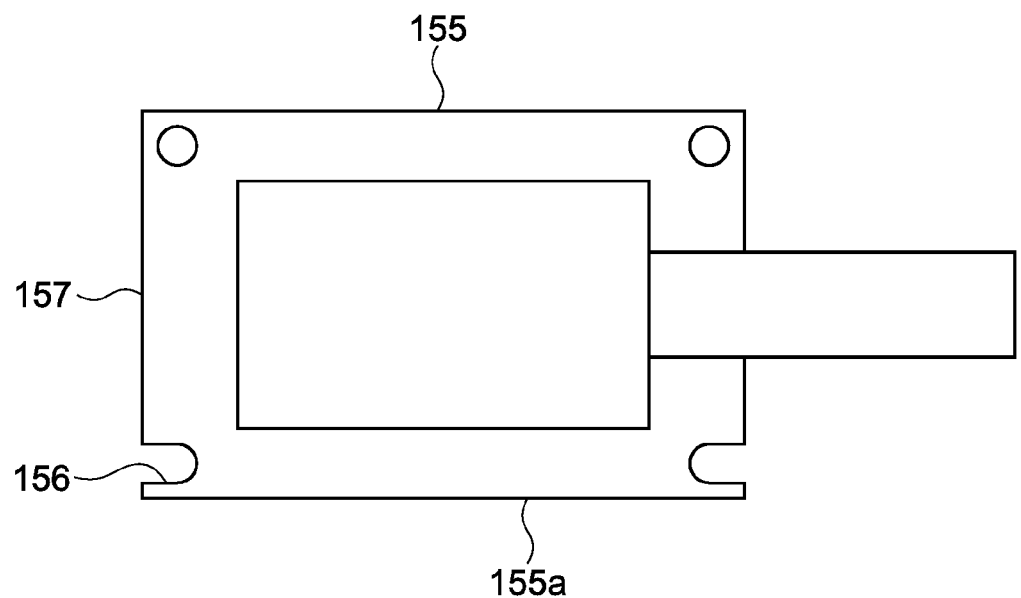
FIG. 10 is a figure showing a variation example of positions and shapes of cut-out-through-holes.
Figure 11:
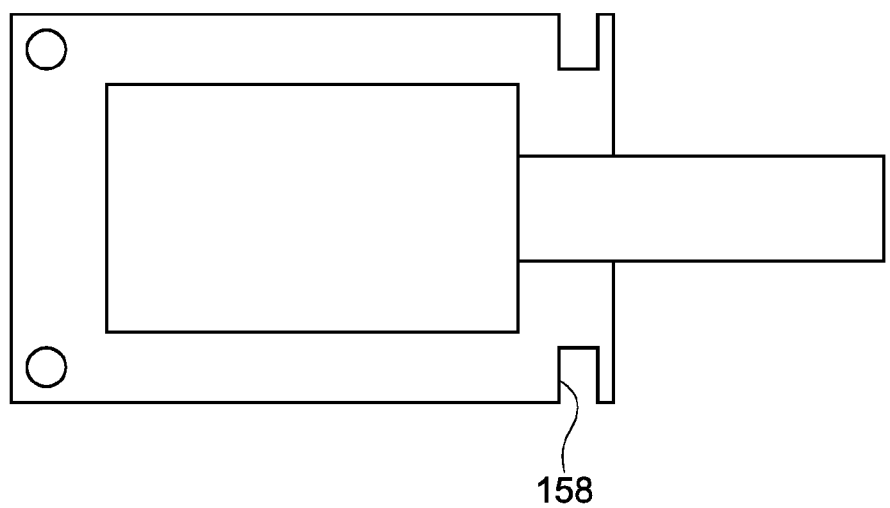
FIG. 11 is a figure showing a variation example of positions and shapes of cut-out-through-holes.

As shown in FIGS. 9 and 10, cut-out-through-holes 156 may be formed at the both ends of one long side 155a of a pair of long sides 155. In this case, each of the two cut-out-through-holes 156 may have its part opened toward an outer edge of the long side 155a (see FIG. 9), or have its part opened toward an outer edge of a short side 157 at each end of the long side 155a (see FIG. 10). The shape of the cut-out-through-holes, as seen from a direction of penetration through the cut-out-through-holes, is not limited. For example, it may be a so-called U-shape which has a substantially circular part and has its part opened, as in the cut-out-through-holes 49 shown in FIGS. 3A and 3C; or a substantially rectangular shape as in cut-out-through-holes 158 shown in FIG. 11. The shape of the cut-out-through-holes may be designed as appropriate, as long as a relief where the screw can slide is ensured, and the holder part can be held pressed by a head of the screw.

As described above, in the liquid crystal display unit 30 according to this embodiment, the liquid crystal panel 31 is held by the holding portion 46 of the holder part 32. The holder part 32 is connected to the fixing member 34 by each connecting portion 47. Since the attenuation portion 48 is formed in the area from the connecting portion 47 to the holding portion 46, in the second thickness t2 that is smaller than the first thickness t1, it can prevent transmission of the stress to the holding portion 46 which stress is generated in the connecting portion 47 by external force or the like. In addition, since the cut-out-through-holes 49 each having its part opened is formed as some of the through-holes 45 which allow insertion of the screws 42, it can prevent influence of effects such as expansion of the holder part 32 due to heat. It thus makes it possible to prevent influence of external force or heat.

In recent years, high luminance, high contrast and high resolution has been sought in projection display apparatuses, to improve image quality in the images that would be displayed. In response to this, it has been intended to perform positional adjustment of each liquid crystal panel with good precision, so that each of the colored images of RGB can be accurately superimposed to each other on the screen with minimal deviation. Meanwhile, along with an increase in luminance, as an amount of light that enters the liquid crystal panel is increased, deformation of the liquid crystal panel due to the resulting heat has become a major problem. That is, the deformation of the liquid crystal panel would cause stress to be applied into a liquid crystal. Further, there is also an effect of an increase in contrast. As a result, for example, in cases of displaying black images, an irregularity of polarized light due to stress has become conspicuous. Therefore, it has been a problem that unevenness in color and brightness might occur in the screen that is desirable to have a single black color, and lead to deterioration in image quality.

Besides, as resolution increases, there is a tendency that a size of one pixel of the liquid crystal panel becomes smaller, and this has made a permissible amount of displacement of the liquid crystal panel smaller. However, with an increase in the amount of light entering the liquid crystal panel, the heat generated therefrom might cause a positional shift of the liquid crystal panel by thermal deformation. This has been one of the causes of a failure in superposition of the colored images in the projected image, that is, a cause of deviation in registration.

In this embodiment, by forming the relatively thin attenuation portion 48 and the cut-out-through-hole 49 having its part opened so as to positively absorb the stress, it has made it possible to prevent the stress being applied into the liquid crystal and positional shifts of the liquid crystal panel 31. That is, by reducing the thickness to make a thin portion, while a distortion in this part becomes larger, a cross-sectional secondary moment can be reduced and the stress caused in the attenuation portion can therefore be reduced. The holding portion 46 that holds the liquid crystal panel 31 may be formed in a thick structure having a relatively large thickness for realizing its rigidity; and thus, in a boundary of the thin portion (attenuation portion) and thick portion (holding portion), the transmission of the stress may be cut off. This has made it possible to sufficiently reduce the stress transmitting from the holder part 32 to the effective pixel part of the liquid crystal panel 31.

In addition, the cut-out-through-hole 49 provides a direction in which the stress can be released. This enables to reduce the stress transmitting to the effective pixel part. Further, by positively allowing the deformation by providing the open end 54, it has made it possible to reduce stress accumulation due to the difference of the linear expansion coefficient between the materials; thereby preventing deviation in registration. Therefore, while realizing high luminance, high contrast and high resolution; it can prevent deterioration in image quality caused by unevenness in color, unevenness in brightness, and a failure in superposition of the colored images. This may provide an image with improved quality.

Second Embodiment

A liquid crystal display unit according to a second embodiment of the present disclosure will be described. In the following descriptions, the same part as the configuration and the effect of the liquid crystal display unit which has been illustrated as the above-described embodiment will be simplified or omitted.

Figure 12:
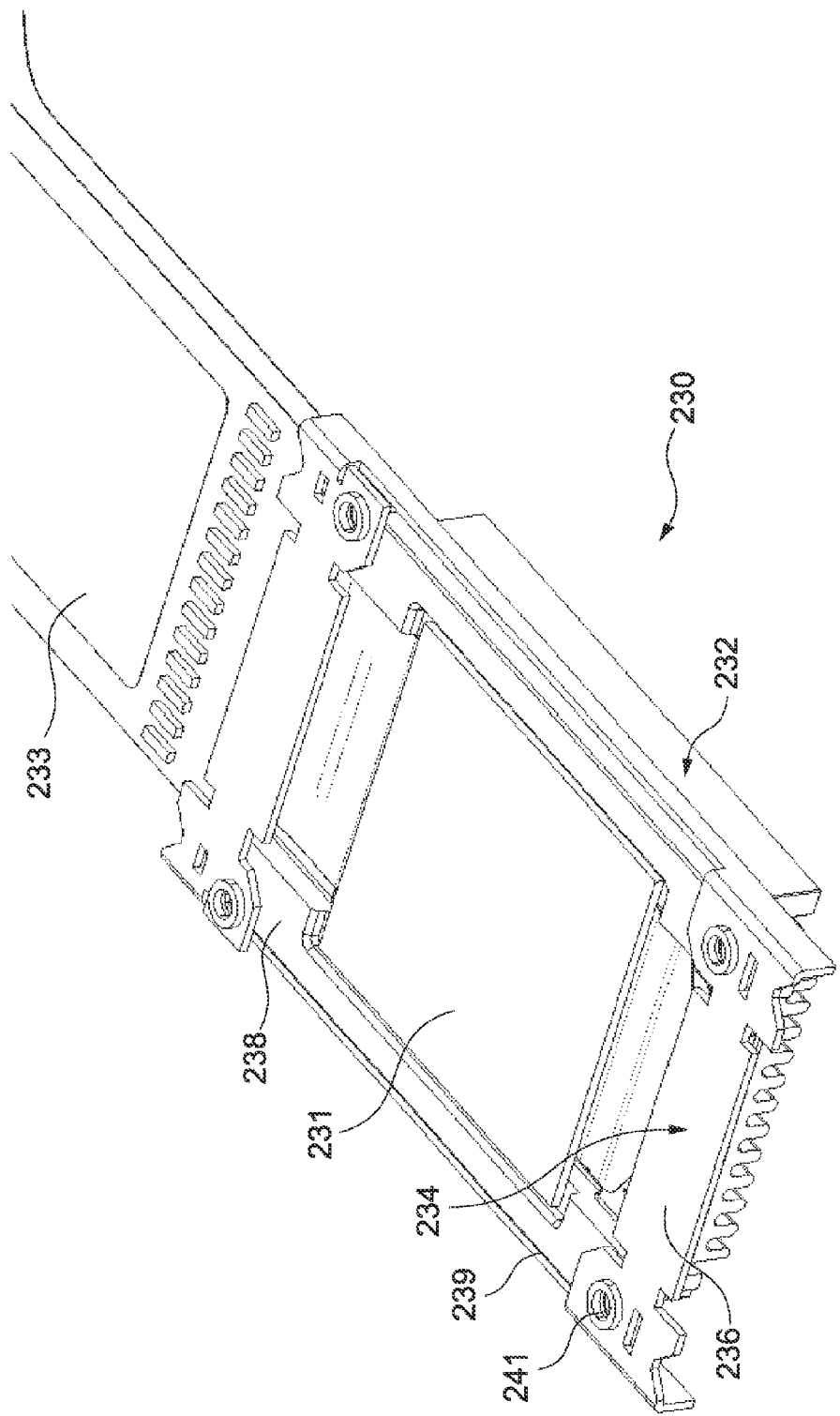
FIG. 12 is a perspective view showing a liquid crystal display unit according to a second embodiment of the present disclosure.
Figure 13:
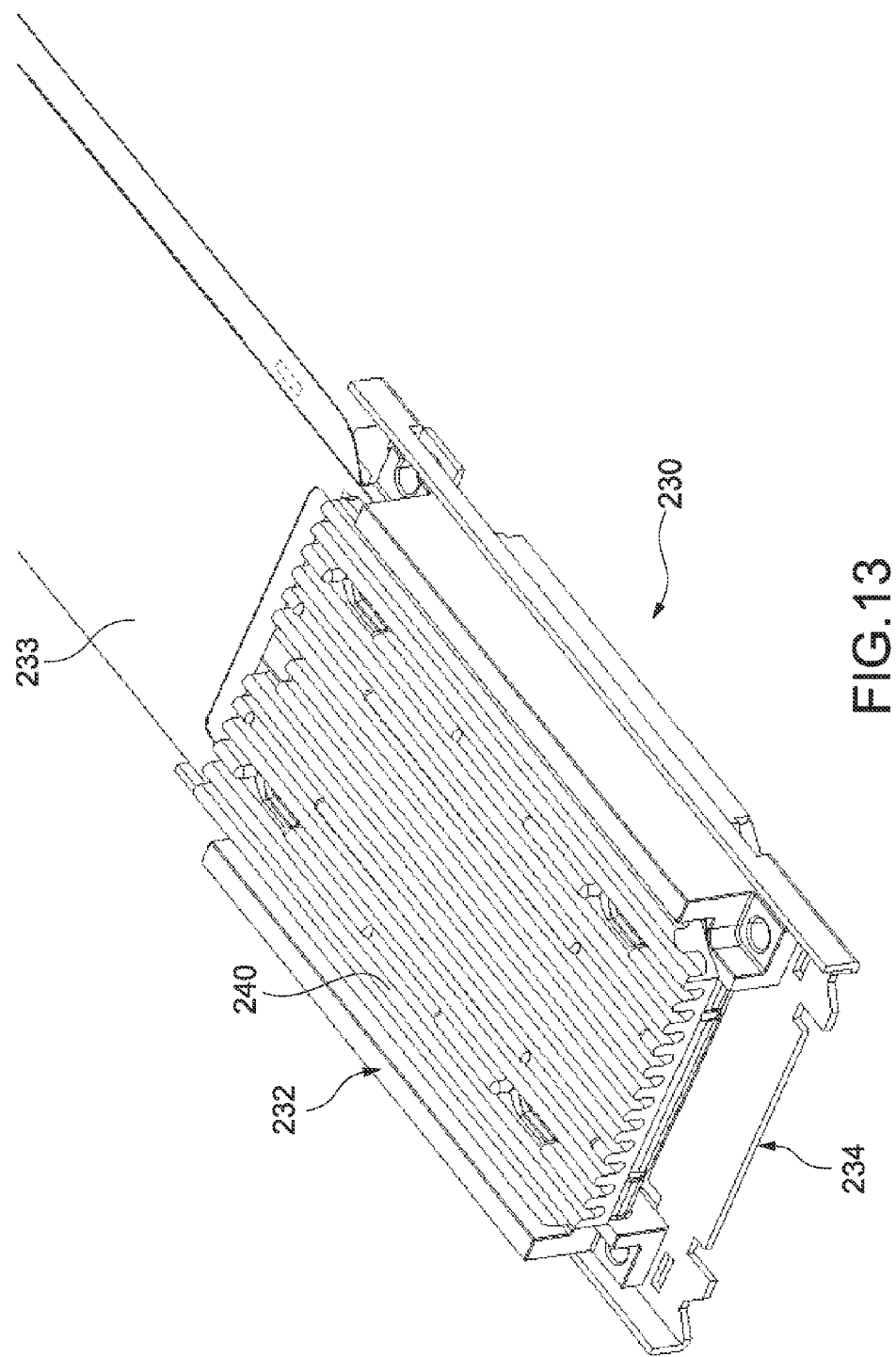
FIG. 13 is a figure showing a rear side of the liquid crystal display unit according to the second embodiment.

FIG. 12 is a perspective view showing a liquid crystal display unit 230 according to this embodiment. FIG. 13 is a figure showing a rear side of the liquid crystal display unit 230.

The liquid crystal display unit 230 according to this embodiment includes a basic configuration substantially similar to that described in the first embodiment. That is, the liquid crystal display unit 230 includes a liquid crystal panel 231; and a holder part 232 for holding the liquid crystal panel 231. The liquid crystal panel 231 is configured so that a flexible circuit board 233 may be connected thereto. The holder part 232 is configured to be connected to a fixing member 234. In addition, as shown in FIG. 13, a heat sink 240 for cooling the liquid crystal panel 231 and the holder part 232 is disposed on a rear surface side of the holder part 232.

An opening 239 is formed in a principal surface portion 236 of the fixing member 234; and light may enter and be output through this opening 239. In the four corners of the principal surface portion 236, screw-holes 241 may be formed. From a rear side of the holder part 232, screws may be inserted into the screw-holes 241. The holder part 232 is thus connected to the fixing member 234.

Incidentally, a variety of optical members may be mounted on the principal surface 238 of the holder part 232, in an area of the opening 239 of the fixing member 234. The liquid crystal display unit 230 may make up a package, together with these optical members. For example, a panel cover, a light-shielding plate, a pre-light-shielding plate holder, an optical compensation element holder, an optical compensation element, a packing and a pre-light-shielding plate may be mounted in this order on the principal surface 238 of the holder part 232. Examples of such configurations may include those as described in the aforementioned Patent Document 1, the entire content of which is also incorporated herein by reference.

Figure 14:
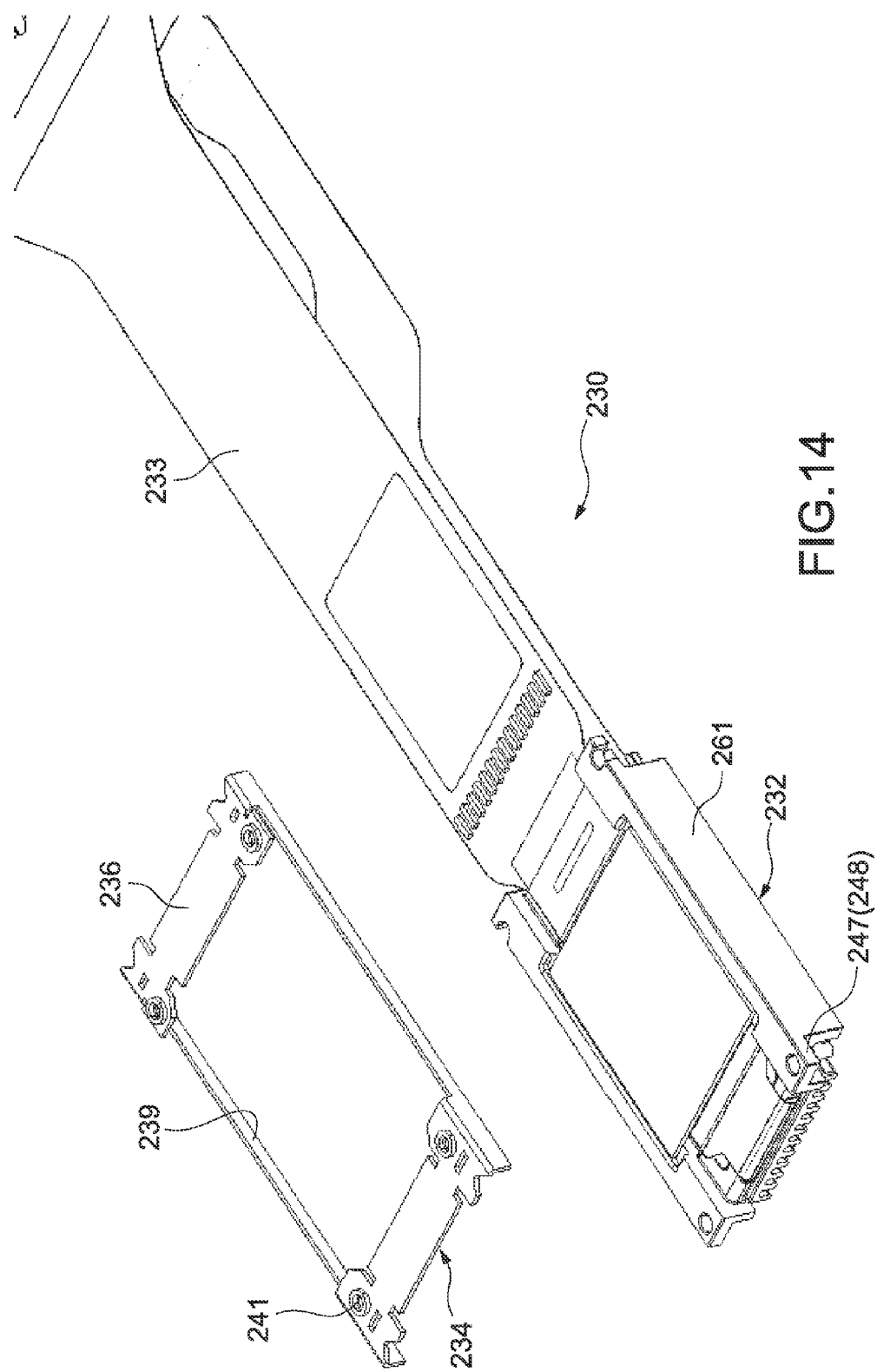
FIG. 14 is a figure showing a state where a fixing member and a holder part are detached from each other.
Figure 15:
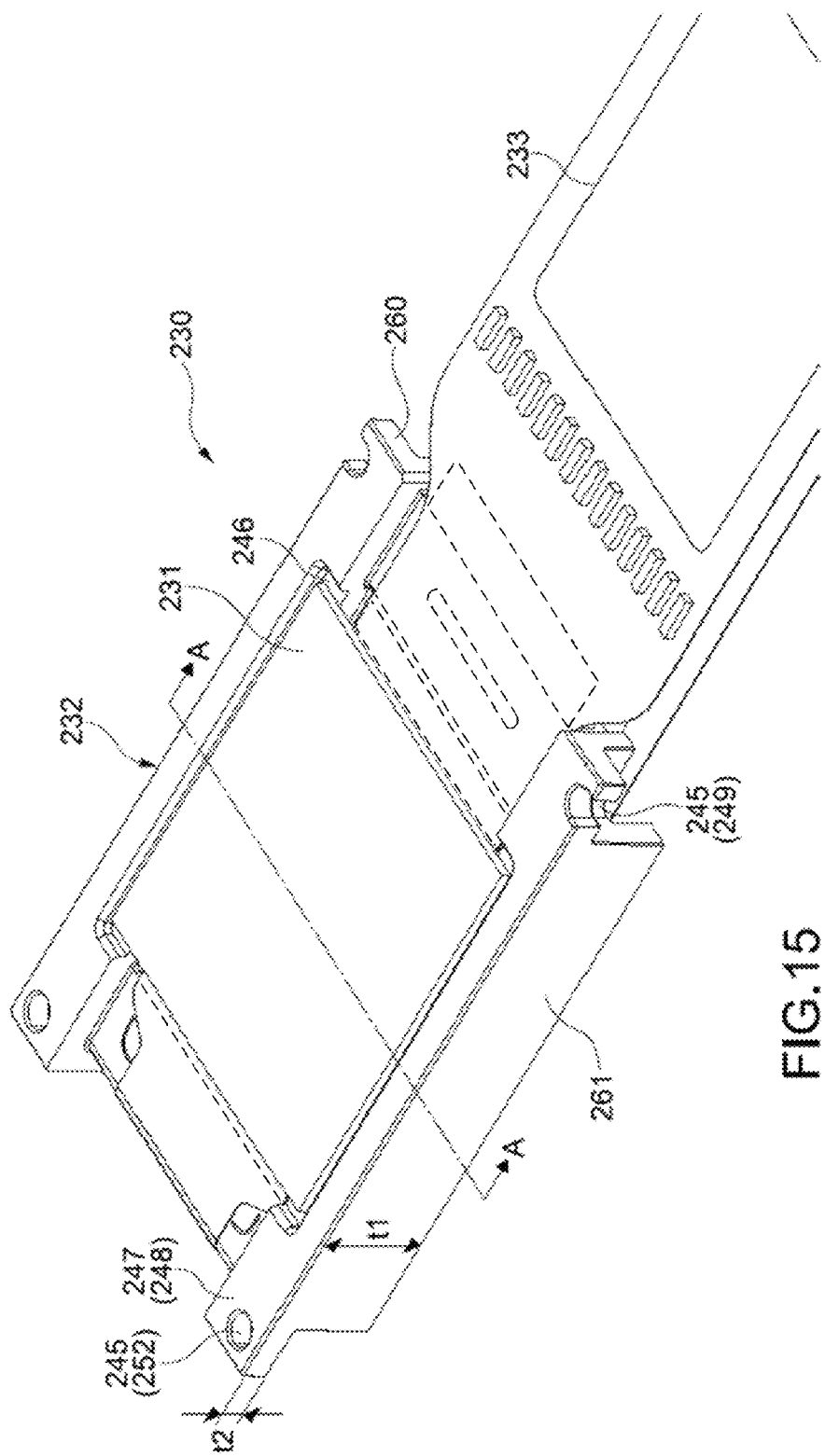
FIG. 15 is an enlarged view showing the holder part according to the second embodiment.
Figure 16:
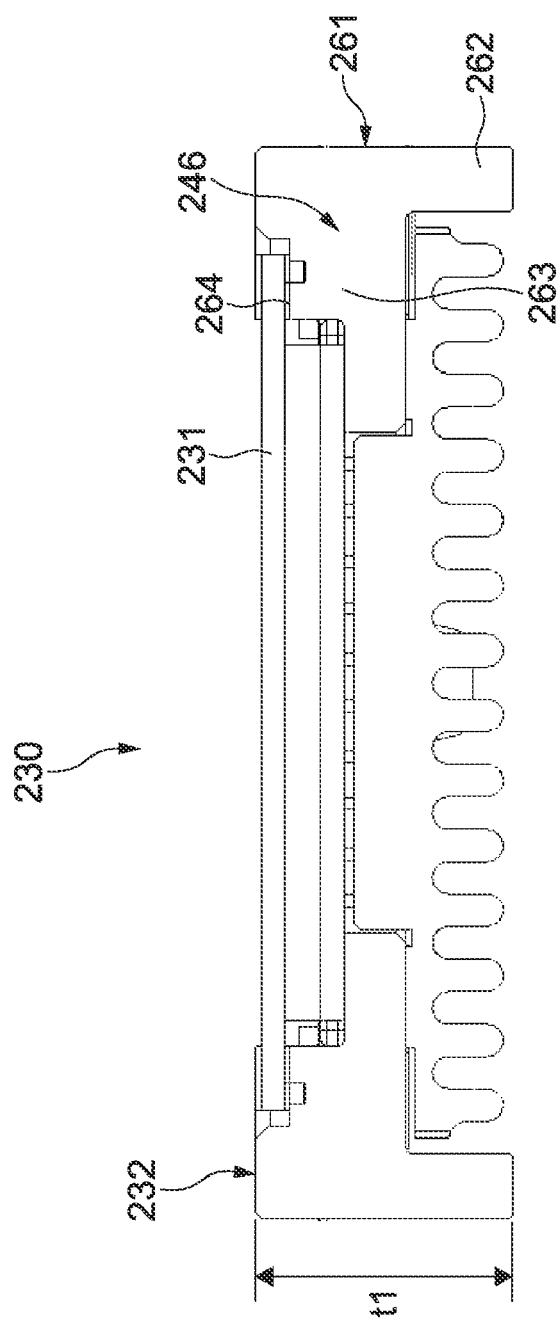
FIG. 16 is a cross-sectional view taken along the A-A line shown in FIG. 15.

FIG. 14 is a figure showing a state where the fixing member 234 and the holder part 232 are detached from each other. FIG. 15 is an enlarged view showing the holder part 232. FIG. 16 is a cross-sectional view taken along the A-A line shown in FIG. 15.

The holder part 232 according to this embodiment has a substantially rectangular shape as viewed from above, and has a pair of long sides 261 opposite to each other. The "long side 261" means an area along a long side of the holder part 232. In a center of each of the long sides 261, a holding portion 246 for holding the liquid crystal panel 231 is formed.

As shown in FIG. 16, the long sides 261 each have a supporting portion 262 which has a largest thickness thereof and becomes an outer edge; and a placement portion 263 formed extending inward from each supporting portion 262. In the placement portion 263, a placement surface 264 is formed as a step formed thereto. The liquid crystal panel 231 may be mounted on the placement surface 264. The area in the center of the long side as a whole, which includes the placement surface 264 and the placement portion 263, would function as the holding portion 246. A rigidity of this holding portion 246 can be determined mainly according to the supporting portion 262 which has the largest thickness. Therefore, in this embodiment, the first thickness t1 of the holding portion 246 may be considered on the basis of the thickness of the supporting portion 262. Accordingly, for the first thickness t1 of the holding portion, the thickness of the part contributing to rigidity of the holding portion may typically be selected.

The flexible circuit board 233 would be inserted from an end of the holder part 232 at its short side 260, to be connected to the liquid crystal panel 231. That is, in this embodiment, the long sides 261 are formed so as to extend in a same direction as a connecting direction for connecting the flexible circuit board 233 to the liquid crystal panel 231. The liquid crystal panel 231 is held by those long sides 261. In other words, holding of the liquid crystal panel 231 is realized by the long sides 261; and an area between the long sides 261 are used for connection of the flexible circuit board 233 and the liquid crystal panel 231. This allows the liquid crystal display unit 230 to be made smaller. However, it may also be configured so that the liquid crystal panel 231 can be held by two short sides which are the areas along the respective short sides 260 and the flexible circuit board 233 can be connected to the liquid crystal panel 231 in a direction along its short-side direction.

As shown in the figures such as FIG. 15, connecting portions 247 are formed as four connecting portions 247 formed in both ends of the pair of long sides 261. The Further, the connecting portions 247 are formed in the second thickness t2 that is smaller than the first thickness t1, to serve as an attenuation portion 248. In other words, the connecting portions 247 are formed in a thickness that is smaller than the thickness of the supporting portion 262. It should be noted that the possible second thickness t2 may also be larger than the placement portion 263 in the holding portion 246, as long as it is within the range of smaller than the first thickness t1. In order to allow the force transmitting to the supporting portion 262 to be attenuated, the connecting portions 247 (the attenuation portion 248) can be formed in a thickness that is smaller than the thickness of the supporting portion 262.

In the four connecting portions 247, respectively, through-holes 245 through which the screws may be inserted are formed. In this embodiment, the two connecting portions 247 being formed at a same end of the respective long sides 261 have cut-out-through-holes 249 respectively formed thereto. Specifically, the two cut-out-through-holes 249 may be formed at the side where the flexible circuit board 233 would be connected. Each of the two cut-out-through-holes 249 has its part opened toward an outer edge of the pair of long sides 261. The other end of the long sides 261 have two through-holes 252 formed thereto, each having their circumference closed. Such a configuration makes it possible to sufficiently absorb expansion, and the like, mainly in the extending direction of the long sides 261.

Incidentally, in the same manner as has been shown in FIGS. 8 to 11, the two cut-out-through-holes 249 may be formed in two connecting portions 247 which are formed at the both ends of one long side 261, among the four connecting portions 247. In addition, a direction to which the cut-out-through-holes 249 are opened, that is, the position of an open end of the cut-out-through-holes 249, the shape thereof, and the like may also be designed as appropriate.

Figure 17:
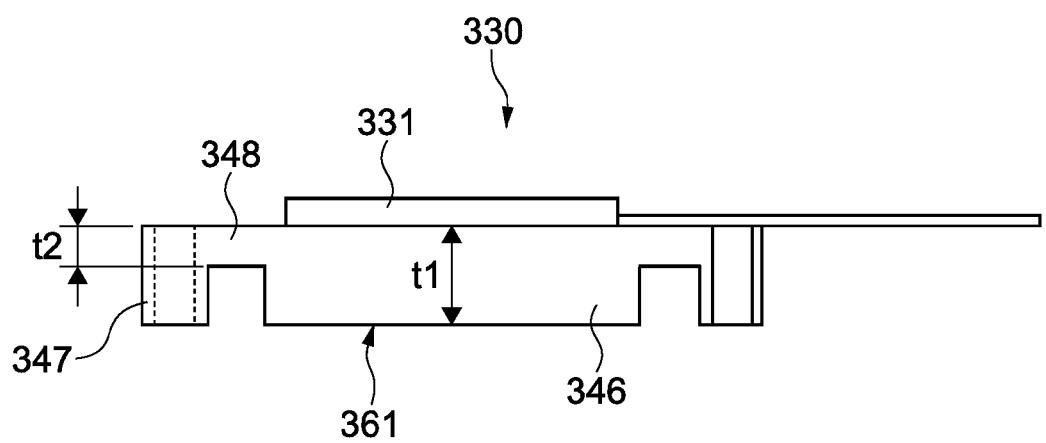
FIG. 17 is a side view showing a variation example of the liquid crystal display unit according to the second embodiment.

FIG. 17 is a side view showing a variation example of the liquid crystal display unit 230 according to this embodiment. As shown in FIG. 17, this liquid crystal display unit 330 includes an attenuation portion 348 having the second thickness smaller than the first thickness, which attenuation portion 348 is formed in an area from a connecting portion 347 to a holding portion 346 of a pair of long sides 361. Such a configuration may also allow the force transmitting to the holding portion 346 to be attenuated.

As described above, in the liquid crystal display unit 230, the liquid crystal panel 231 is held by the pair of long sides 261 forming the attenuation portion 248. In the connecting portions 247, the cut-out-through-holes 249 have been formed. Such a configuration may also have an effect similar to the above-described embodiments, and it thus makes it possible to sufficiently prevent influence of external force or heat.

Other Embodiments

The present disclosure is not limited to each of the foregoing embodiments but may be in various other embodiments.

In the above, a liquid crystal display unit having a reflective liquid crystal panel has been employed. However, the present disclosure is also applicable to a liquid crystal display unit having a transmissive liquid crystal panel. In other words, an embodiment of the present disclosure may be configured in any manner as long as the holder part is configured not to block the incident light and output light (transmitted light); and has the attenuation portion and the cut-out-through-hole being formed to the holder part. This makes it possible to prevent influence of external force or heat.

In the above, four through-holes have been formed in four corners of the holder part having a substantially rectangular shape, and two through-holes have been formed as the cut-out-through-holes. These two through-holes have been formed at both ends of one long side, or at both ends of one short side, of the holder part. If the two cut-out-through-holes were to be formed at the position diagonal to each other in the holder part, for example, it might be difficult to release deformation due to expansion, and this would cause stress to the liquid crystal panel 31. Accordingly, the cut-out-through-holes may be formed at one side instead of the diagonal position of the holder part, and this enables to regulate the direction of expansion, to absorb deformation in that direction. However, depending on the shape of the holder part, the number of the through-holes (for example, in cases where two through-holes are provided), or the positions where the through-holes are formed, an embodiment in which the cut-out-through-holes are formed at diagonal position may also be possible.

In the above, a portion having a relatively small thickness has been formed as the attenuation portion to attenuate the force that is transmitted. However, a configuration of the attenuation portion is not limited thereto. For example, the attenuation portion may be made by using other members such as an elastic member capable of absorbing the forces. Other configurations may also be employed.

At least two features of the features in each embodiment described above may be combined with each other.

The present disclosure may employ the following configurations.

(1) A liquid crystal display unit including:
   a liquid crystal display element configured to modulate light; and
   a holder part having
      a holding portion configured to hold the liquid crystal display element,
      at least one connecting portion formed integrally with the holding portion, and being configured to be connected to a fixing member for fixing a position of the liquid crystal display element,
      an attenuation portion formed in the area from the connecting portion to the holding portion, and being configured to attenuate a force transmitting from the connecting portion to the holding portion, and
      a plurality of through-holes formed in the at least one connecting portion, the through-holes including at least one cut-out-through-hole having its part opened, the through-holes being configured to allow insertion of connecting members for connection to the fixing member.

(2) The liquid crystal display unit according to (1), in which
   the holding portion has a first thickness; and
   the attenuation portion is formed in a second thickness smaller than the first thickness.

(3) The liquid crystal display unit according to (2), in which
   the connecting portion is formed in the second thickness to serve as the attenuation portion.

(4) The liquid crystal display unit according to (2) or (3), in which
   the second thickness is one-half of the first thickness or smaller.

(5) The liquid crystal display unit according to any one of (2) to (4), in which
   the holder part has a substantially rectangular shape and has a pair of long sides opposite to each other,
   the holding portion is formed in a center of each of the long sides, the at least one connecting portion includes four connecting portions formed in both ends of the long sides, and the attenuation portion is formed, in the second thickness, in areas from the respective connecting portions to the holding portion of the long sides.

(6) The liquid crystal display unit according to (5), in which each cut-out-through-hole has its part opened toward an outer edge of the long sides.

(7) The liquid crystal display unit according to (5) or (6), in which each cut-out-through-hole is formed in each of two connecting portions among the four connecting portions, the two connecting portions being formed at a same end of the respective long sides.

(8) The liquid crystal display unit according to (5) or (6), in which each cut-out-through-hole is formed in each of two connecting portions among the four connecting portions, the two connecting portions being formed at the both ends of one long side of the long sides.

(9) The liquid crystal display unit according to any one of (5) to (8), in which the long sides extend in a same direction as a connecting direction for connecting a flexible circuit board to the liquid crystal display element.

(10) The liquid crystal display unit according to any one of (1) to (4), in which the holder part has a substantially rectangular shape, the holding portion is formed in a center of the holder part, and the at least one connecting portion includes four connecting portions formed in four corners of the holder part.

(11) The liquid crystal display unit according to any one of (1) to (10), in which the liquid crystal display element is a reflective liquid crystal display element.

It should be understood by those skilled in the art that various modifications, combinations, sub-combinations and alterations may occur depending on design requirements and other factors insofar as they are within the scope of the appended claims or the equivalents thereof.

What is claimed is:

1. A liquid crystal display unit comprising:
    a liquid crystal display element configured to modulate light; and
    a holder part having
        a holding portion configured to hold the liquid crystal display element, the holding portion having a first side and a second side,
        at least one connecting portion formed integrally with the holding portion, and being configured to be connected to a fixing member for fixing a position of the liquid crystal display element,
        an attenuation portion formed in the area from the connecting portion to the holding portion, the attenuating portion attenuating a force transmitting from the connecting portion to the holding portion, and
        a plurality of through-holes formed in the at least one connecting portion, the through-holes including at least one cut-out-through-hole having its part opened, the through-holes being configured to allow insertion of connecting members for connection to the fixing member, wherein the at least one cut-out-through-hole has an elongated, open-ended shape, and wherein the at least one cut-out-through-hole includes two cut-out-through-holes, the two cut-out-through-holes being disposed only in the connecting portion that is disposed in the first side;
        the holding portion has a first thickness; and the attenuation portion is formed in a second thickness smaller than the first thickness;
        the connecting portion is formed in the second thickness to serve as the attenuation portion;
        the second thickness is one-half of the first thickness or smaller.

2. The liquid crystal display unit according to claim 1, wherein
    the holder part has a substantially rectangular shape and has a pair of long sides opposite to each other,
    the holding portion is formed in a center of each of the long sides,
    the at least one connecting portion includes four connecting portions formed in both ends of the long sides, and
    the attenuation portion is formed, in the second thickness, in areas from the respective connecting portions to the holding portion of the long sides.

3. The liquid crystal display unit according to claim 2, wherein
    each cut-out-through-hole has its part opened toward an outer edge of the long sides.

4. The liquid crystal display unit according to claim 2, wherein
    each cut-out-through-hole is formed in each of two connecting portions among the four connecting portions, the two connecting portions being formed at a same end of the respective long sides.

5. The liquid crystal display unit according to claim 2, wherein
    each cut-out-through-hole is formed in each of two connecting portions among the four connecting portions, the two connecting portions being formed at the both ends of one long side of the long sides.

6. The liquid crystal display unit according to claim 2, wherein
    the long sides extend in a same direction as a connecting direction for connecting a flexible circuit board to the liquid crystal display element.

7. The liquid crystal display unit according to claim 1, wherein
    the holder part has a substantially rectangular shape,
    the holding portion is formed in a center of the holder part, and
    the at least one connecting portion includes four connecting portions formed in four corners of the holder part.

8. The liquid crystal display unit according to claim 1, wherein the liquid crystal display element is a reflective liquid crystal display element.

9. A projection display apparatus comprising:
    a light source configured to emit light; and
    a liquid crystal display unit configured to modulate the light from the light source;
    the liquid crystal display unit including
    a) a liquid crystal display element configured to modulate the light; and
    b) a holder part, having
        a holding portion configured to hold the liquid crystal display element,
        at least one connecting portion formed integrally with the holding portion, and being configured to be connected to a fixing member for fixing a position of the liquid crystal display element,
        an attenuation portion formed in the area from the connecting portion to the holding portion, the attenuating portion attenuating a force transmitting from the connecting portion to the holding portion, and a plurality of through-holes formed in the at least one connecting portion, the through-holes including at least one cut-out-through-hole having its part opened, the through-holes being configured to allow insertion of connecting members for connection to the fixing member, wherein the at least one cut-out-through hole has an elongated, open-ended shape, and wherein the at least one cut-out-through-hole includes two cut-out-through-holes, the two cut-out-through-holes being disposed only in the connecting portion that is disposed in the first side;

the holding portion has a first thickness; and the attenuation portion is formed in a second thickness smaller than the first thickness;

the connecting portion is formed in the second thickness to serve as the attenuation portion;

the second thickness is one-half of the first thickness or smaller.

* * * * *